(12) United States Patent
Kasahara

(10) Patent No.: US 7,304,413 B2
(45) Date of Patent: Dec. 4, 2007

(54) PIEZOOSCILLATOR

(75) Inventor: Kenji Kasahara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/501,133

(22) Filed: Aug. 8, 2006

(65) Prior Publication Data

US 2007/0035214 A1 Feb. 15, 2007

(30) Foreign Application Priority Data

Aug. 10, 2005 (JP) .............................. 2005-231658

(51) Int. Cl.
*H01L 41/053* (2006.01)

(52) U.S. Cl. ....................... 310/326; 310/348
(58) Field of Classification Search ................ 310/326, 310/348
See application file for complete search history.

(56) References Cited

U.S. PATENT DOCUMENTS 4,940,914 A * 7/1990 Mizuno et al. ............. 310/326
7,015,627 B2 * 3/2006 Serizawa ..................... 310/340

FOREIGN PATENT DOCUMENTS

| JP | 62-281434 | * | 12/1987 |
| JP | 02-010858 | * | 1/1990 |
| JP | 4-117910 | * | 4/1992 |
| JP | 07-218758 | * | 8/1995 |
| JP | 2003-141866 | * | 5/2003 |
| WO | WO-2003-019690 | * | 3/2003 |

* cited by examiner

Primary Examiner—Thomas M. Dougherty
(74) Attorney, Agent, or Firm—Jordan and Hamburg LLP

(57) ABSTRACT

A piezooscillator having a piezoelectric resonator, composed of: a case surrounding a space where the piezoelectric resonator is provided and including a substrate and a cover; a buffer material supporting the piezoelectric resonator and suppressing a shock conveyed from the case to the piezoelectric resonator; and a wiring member electrically connecting the piezoelectric resonator and the substrate and having flexibility, or composed of: a case surrounding a space where the piezoelectric resonator is provided and including a first substrate and a cover; a second substrate mounting the piezoelectric resonator thereon; a buffer material supporting the second substrate and suppressing a shock conveyed from the case to the piezoelectric resonator; and a wiring member electrically connecting the first and second substrates and having flexibility, in which, when the case suffers the shock from outside, the buffer material absorbs the shock to prevent the shock conveyance to the piezoelectric resonator and frequency variation arising in the piezooscillator, realizing shock-resistance improvement, is provided.

8 Claims, 8 Drawing Sheets

PIEZOOSCILLATOR

BACKGROUND OF THE INVENTION

1. Field of the Invention

The present invention relates to a piezooscillator having a piezoelectric resonator.

2. Description of the Related Art

As an example crystal oscillator having a crystal resonator being a piezoelectric resonator, that having a structure shown in FIGS. 7A, 7B, 7C, 7D is known. In FIG. 7, "11" denotes a crystal resonator having a structure in which a crystal piece and a pair of excitation electrodes are enclosed in a square package while being held, for example, by a support member. In the drawing, "12" denotes a base substrate mounting the crystal resonator 11 thereon, and an oscillation circuit to oscillate the crystal resonator 11 is built in the base substrate 12. In the drawing, "13" denotes a lead wire, and, for example, one end of the lead wire 13 is connected to each excitation electrode in the package of the crystal resonator 11. Further, the other end of the lead wire 13 is connected to an electrode 14 provided on the base substrate 12, and the crystal resonator 11 and the electrode 14 provided on the base substrate 12 are electrically connected via the lead wire 13. In the drawing, "15" denotes a cover provided on the base substrate 12 so as to cover the crystal resonator 11, and it is designed that, when the crystal resonator 11 oscillates, for example, this crystal oscillator being denoted by "1A" is heated from outside the crystal oscillator 1A by a heating means such as a heater so that a space 16 surrounded by the cover 15 and the base substrate 12 is kept at a constant temperature. Specifically, this crystal oscillator 1A is structured as an OCXO (Oven Controlled Crystal Oscillator). Note that "17" in the drawing denotes an electrode provided on a reverse face of the base substrate 12.

Further, the description will be given of the other example crystal oscillator with reference to FIGS. 8A, 8B, 8C, and "18" in the drawing denotes an oscillation circuit board having a built-in oscillation circuit to oscillate the crystal resonator 11. In the drawing, "10" denotes a base substrate, and the oscillation circuit board 18 is fixed to the base substrate 10 in a floating state therefrom via support posts 19 being hard lead pins. Note that, although the drawing is omitted here to avoid complication, the support posts 19 are connected the electrods provided on the base substrate 10 and the oscillation circuit board 18 respectively via a solder or the like, so that the electrode provided on the base substrate 10 and the electrode provided on the oscillation circuit board 18 are electrically connected. Except such a difference, this crystal oscillator being denoted by "1B" is structured in the same manner as in the previously-described crystal oscillator 1A in FIG. 7, and in the crystal oscillator 1B, the crystal resonator 11 does not contact the base substrate 10 directly, in which the heat of the crystal resonator 11 heated when the crystal resonator 11 oscillates as described above is prevented from leaving to the base substrate 10 and diffusing outside the crystal oscillator 1B, suppressing the consumption power to keep the space 16 at the constant temperature, as a result thereof.

Meanwhile, the crystal oscillator is used in electronic equipment such as mobile communication equipment and transmission communication equipment or in a base station as a high-precision reference oscillation source, however, when transporting the crystal oscillator, or when installing the crystal oscillator into the electronic equipment or the base station, there is a threat for the crystal oscillator of suffering a shock applied from outside and, for example, when the crystal oscillator in FIG. 7 suffers the shock, the shock is conveyed from the base substrate 12 directly to the crystal resonator 11 and, at the same time, the shock is conveyed from the base substrate 12 to the crystal resonator 11 via the lead wire 13. In addition, when the crystal oscillator in FIG. 8 suffers the shock from outside, the shock is conveyed via the base substrate 10, the support post 19 and the oscillation circuit board 18 sequentially to the crystal resonator 11, in which the crystal resonator 11 also has a threat of suffering a shock of the same level as of the shock applied from outside.

On the back of downsizing of the crystal resonator in which the package and the crystal piece are coining close to each other, when a shock is applied from outside directly to the crystal resonator 11, an oscillation stop is possibly caused, for example, by tie crystal piece contacting the package. Further, even though a positional difference of the crystal piece is small, when a high-precise frequency is required to be set, a frequency difference not meeting the specification is possibly caused. The shock-resistance of the crystal resonator is affected by the size, shape and thickness of the crystal piece and the shape of a support member supporting the crystal piece, therefore, the shock-resistance is conventionally improved by contriving the structure of the crystal resonator, however, the structure is made complicated due to the easily-broken crystal piece and the downsizing of the crystal resonator, so that a man-hour is increased and productivity is degraded, and further the downsizing is caused to be prevented. Accordingly, under these circumstances, a downsized crystal oscillator with higher shock-resistance has been demanded.

SUMMARY OF THE INVENTION

The present invention has been made under such circumstances, and an object thereof is to provide, for a piezooscillator having a piezoelectric resonator, the piezooscillator having a superior shock-resistance.

A piezooscillator according to the present invention is a piezooscillator having a piezoelectric resonator comprises: a case surrounding a space in which the piezoelectric resonator is provided and including a substrate and a cover; a buffer material supporting the piezoelectric resonator and suppressing a shock conveyed from the case to the piezoelectric resonator; and a wiring member electrically connecting the piezoelectric resonator and the substrate and having flexibility. Note that "having flexibility" of the wiring member includes a flexibility level in which, when a shock is applied to the substrate, the shock is conveyed to the piezoelectric-resonator via the wiring member without causing any problem.

Another piezooscillator according to the present invention is a piezooscillator having a piezoelectric resonator comprises: a case surrounding a space in which the piezoelectric resonator is provided and including a first substrate and a cover; a second substrate mounting the piezoelectric resonator thereon; a buffer material supporting the second substrate and suppressing a shock conveyed from the case to the piezoelectric resonator; and a wiring member electrically connecting the first substrate and the second substrate and having flexibility.

Further, still another piezooscillator according to the present invention is a piezooscillator having a piezoelectric resonator, comprises: a case surrounding a space in which the piezoelectric resonator is provided and including a first substrate and a cover; a second substrate mounting the piezoelectric resonator thereon; a buffer material supporting the piezoelectric resonator and suppressing a shock conveyed from the case to the piezoelectric resonator; and a wiring member electrically connecting the first substrate and the second substrate and having flexibility.

For instance, an oscillation circuit may be built in the second substrate, further the buffer material may be provided on the substrate or the first substrate side, and further the buffer material may exist between the piezoelectric resonator and the cover.

According to the piezooscillator of the present invention, the piezoelectric resonator is supported by the buffer material in the case having the substrate and the cover, hence, when the shock is applied to the case from outside, the shock is absorbed by the buffer material to be eased and problems such as a variation in the frequency or the oscillation stop of the piezooscillator can be prevented, so that the piezooscillator can be improved in shock-resistance.

DETAILED DESCRIPTION OF THE PREFERRED EMBODIMENT(S)

Figure 1A:
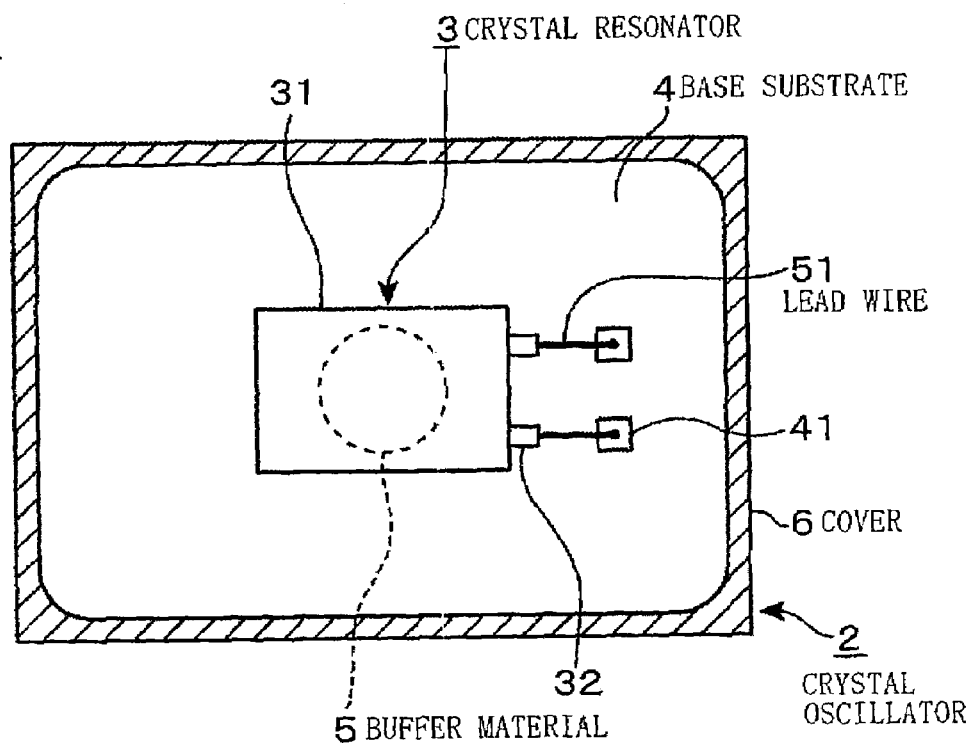
FIGS. 1A, 1B are a horizontal plane view and a vertical side face view, respectively, of a crystal oscillator according to an embodiment of the present invention.
Figure 1B:
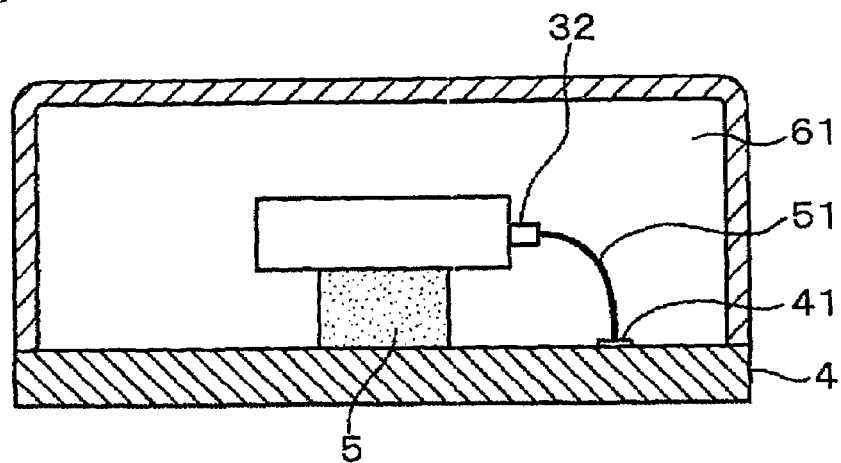
Figure 2A:
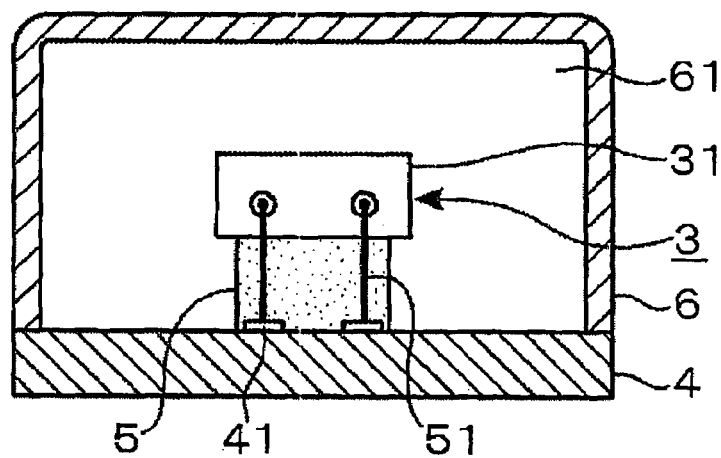
FIGS. 2A, 2B are a vertical rear-side face view and a reverse face view, respectively, of the crystal oscillator according to the embodiment of the present invention.
Figure 2B:
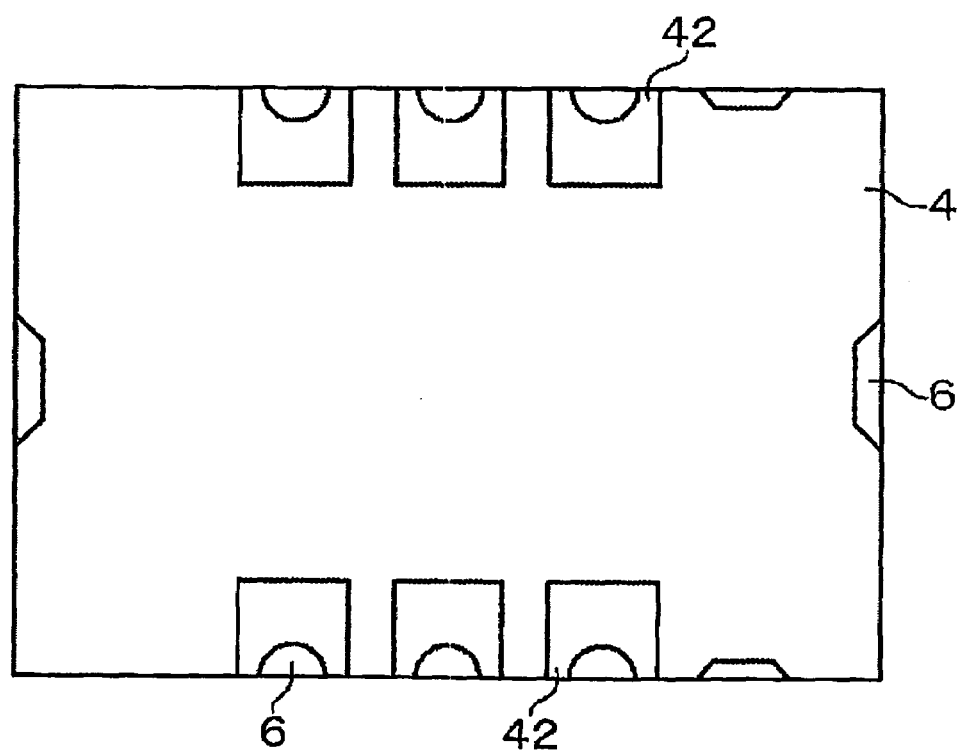

Hereinafter, as an example embodiment of a piezooscillator according to the present invention, a crystal oscillator 2 having a crystal resonator will be described with reference to the drawings. FIG. 1A shows a horizontal plane of the crystal oscillator 2 and FIG. 1B shows a vertical side face thereof, and FIG. 2A shows a vertical rear side face of the crystal oscillator 2 and FIG. 2B shows a reverse face thereof.

In the drawing, "3" denotes a crystal resonator being a piezoelectric resonator, and, in this example, a crystal piece and a pair of excitation electrodes to excite the crystal piece are structured to be enclosed in a square package 31. For example, on the rear side face portion of the square package 31, there are provided two electrodes 32 being electrically connected, for example, to the respective excitation electrodes.

In the drawing, "4" denotes a base substrate in which an oscillation circuit to oscillate the crystal resonator 3 is built, and a buffer material 5 being a gel such as an α (alpha) gel (registered trade name) made mainly of silicone is fixed to the center portion of the base substrate 4. The crystal resonator 3 is supported in a floating state from the base substrate 4 via the buffer material 5 such that the reverse face thereof faces the base substrate 4.

In the drawing, "41" denotes, for example, two pieces of electrodes provided on the base substrate 4. Further, "51" in the drawing denotes two lead wires each of which is an input/output signal line of the crystal resonator 3 and corresponding to a wiring member in claims. As a lead wire 51, for example, a nickel silver wire, a copper wire, or the like is used. One end of each lead wire 51 is connected to the electrode 32 of the crystal resonator 3, respectively, and the other end of each lead wire 51 is connected to the electrode 41, respectively, so that the crystal resonator 3 and the base substrate 4 are electrically connected. Each of the lead wires 51 thus connected to the respective electrodes is formed as a soft wire rod with flexibility at a level not preventing a swing of the crystal resonator 3 when a shock is applied to the crystal oscillator 2 from outside and the shock is conveyed from the base substrate 4 to the crystal resonator 3 via the buffer material 5. Note that "42" in FIG. 2B denotes an electrode provided to connect to the crystal oscillator 2 to equipment on which the crystal oscillator 2 is mounted and provided on a reverse face of the base substrate 4.

A cover 6 together with the base substrate 4 form a case being a thermostatic oven covering the crystal resonator 3 and is provided on the base substrate 4 so that a space 61 surrounded by the cover 6 and the base substrate 4 is isolated from, for example, an external space. Note that isolating the space 61 from the external space is not limited to sealing the space 61, and it is possible that the space 61 is structured to keep ambient temperature of the crystal resonator 3 at a constant temperature when the crystal resonator 3 oscillates by using the space 61 as a heat insulator, as will be described below.

In the crystal oscillator 2 structured as described above, by the oscillation circuit built in the base substrate 4, the crystal resonator 3 oscillates, and the oscillated output power is outputted from the crystal oscillator 2. At a time of the oscillation, the crystal oscillator 2 is heated, for example, by a not-shown heating element such as a heater provided outside the crystal oscillator 2, keeping the ambient temperature of the crystal resonator 3 in the space 61 at a constant temperature, so that the frequency of the oscillated output power is stabilized.

According to the crystal oscillator 2, in the space 61 surrounded by the base substrate 4 and the cover 6, the buffer material 5 is fixed to the base substrate 4 and the crystal resonator 3 is supported in a floating state from the base substrate 4 by the buffer material 5, in which the crystal resonator 3 and the electrodes 41 provided on the base substrate 4 are electrically connected via the lead wire 51 with flexibility at a level not preventing the swing of the crystal resonator 3 caused by the shock applied to the base substrate 4 while the lead wire 51 is in the electrically connected state. Accordingly, when the crystal oscillator 2 receives the shock from outside, the buffer material 5 absorbs the shock to prevent the shock from being conveyed from the base substrate 4 to the crystal resonator 3, and, at the same time, with the flexibility of the lead wire 51, as described above, the crystal resonator 3 can swing above the base substrate 4 to thereby release the conveyed shock. Also, the shock conveyed from the base substrate 4 to the crystal resonator 3 via the lead wire 51 is suppressed as compared to the case where a hard lead wire different, for example, from the lead wire 51 is used, and, as a result, the shock applied to the crystal resonator 3 is suppressed. Accordingly, the crystal piece provided in the crystal resonator 3 is prevented from being shifted, broken, and so forth, and the problems such as the frequency variation, oscillation stop and the like caused thereby in the crystal oscillator 2 are suppressed, and as a result, the crystal oscillator 2 can be improved in shock-resistance.

Note that, as a buffer material 5, that can support the crystal oscillator 2 in a floating state from the base substrate 4 to prevent the shock from being conveyed from the base substrate 4 to the crystal resonator 3 is acceptable, therefore, rubber, sponge, fiber, form material, spring or the like can be used other than the previously-described gel.

Further, as a wire rod electrically connecting the crystal resonator 3 and the electrode 41 provided on the base substrate 4, as previously described, that having the flexibility at a level not preventing the swing of the crystal resonator 3 due to the shock when the crystal oscillator 2 receives the shock from outside is acceptable, therefore, the wire rod is not limited to a linear one such as the lead wire 51 and, for example, a flexible wiring of a film shape may be used.

Figure 3A:
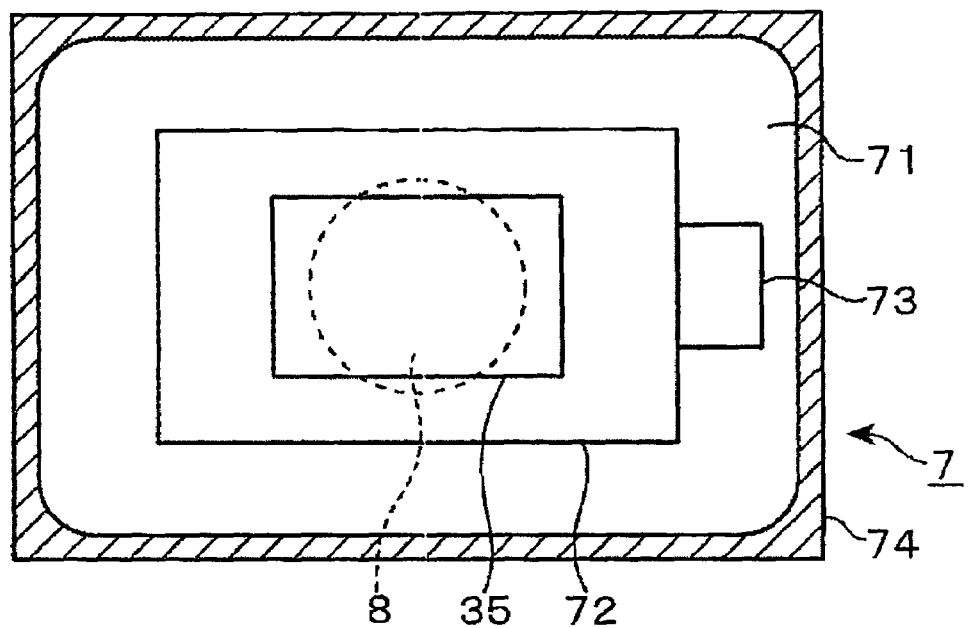
FIGS. 3A, 3B are a horizontal plane view and a vertical side face view, respectively, of a crystal oscillator according to another embodiment of the present invention.
Figure 3B:
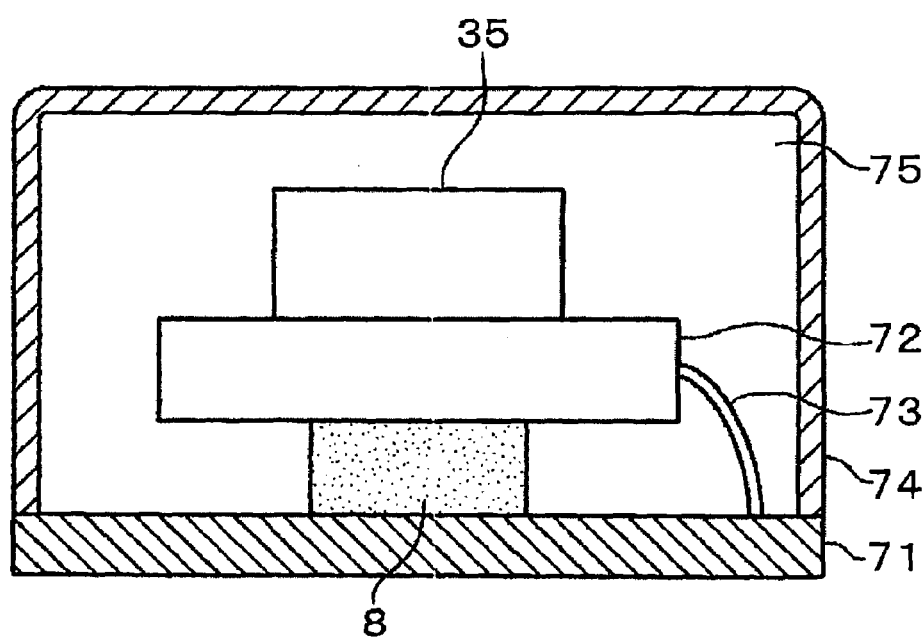
Figure 4A:
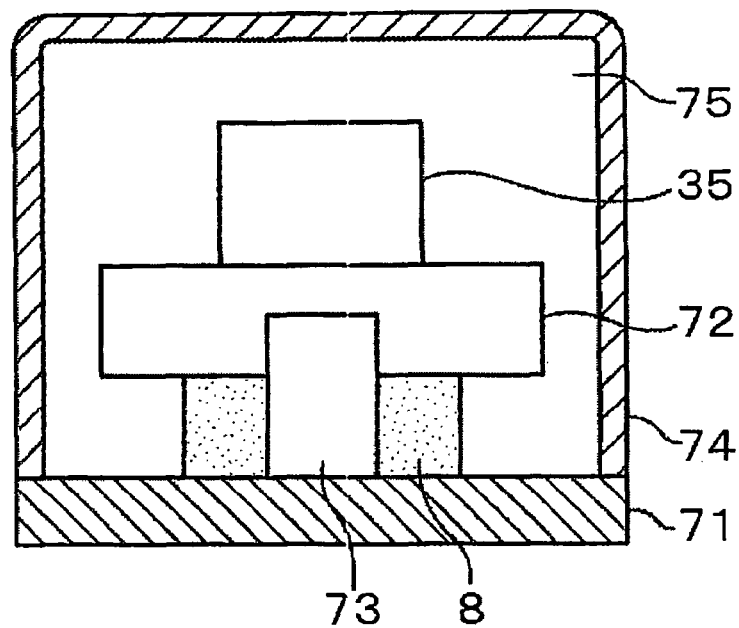
FIGS. 4A, 4B are a vertical rear-side face view and a reverse face view, respectively, of the crystal oscillator according to another embodiment of the present invention.
Figure 4B:
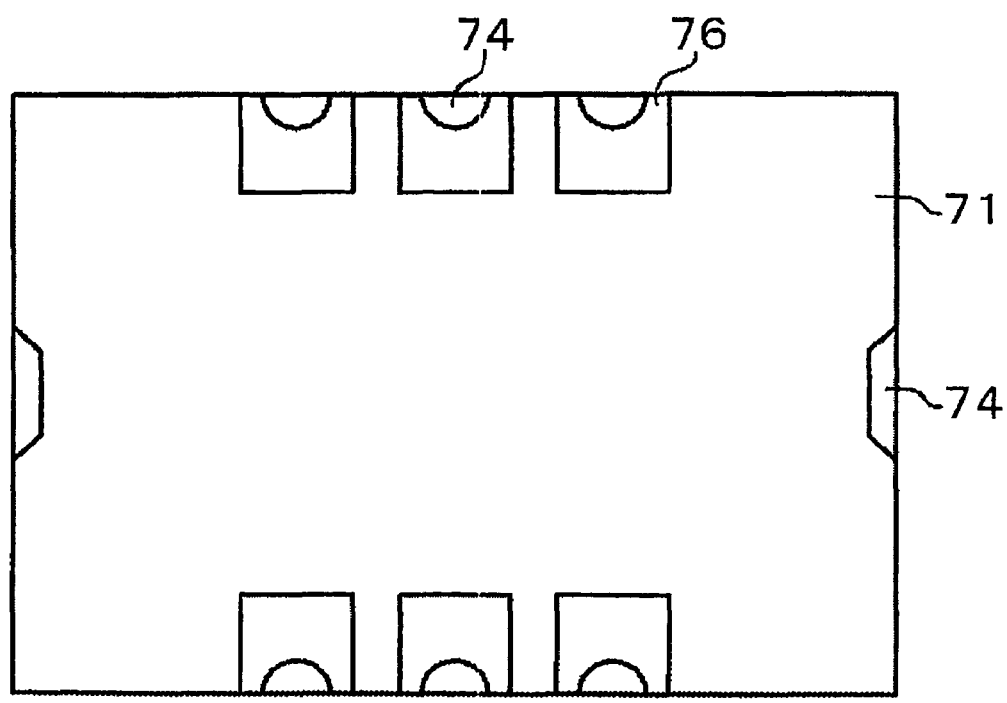

Subsequently, using FIGS. 3A, 3B and FIGS. 4A, 4B, a crystal oscillator 7 being another embodiment will be described. FIGS. 3A and 3B show a horizontal plane and a vertical side face of the crystal oscillator 7, respectively, and FIGS. 4A and 4B show a vertical rear side face and a reverse face of the crystal oscillator 7, respectively, in which "71" denotes a base substrate of which center portion has a buffer material 8 fixed thereto, which is, for example, a gel shaped into, for example, a circle. In the drawing, "72" denotes an oscillation circuit board being a second substrate in which an oscillation circuit to oscillate a later-described crystal resonator 35 is built. The oscillation circuit board 72 is supported in a floating state from the base substrate 71 by the buffer material 8 such that, for example, the reverse face thereof faces the surface of the base substrate 71.

A crystal resonator 35 is mounted on the oscillation circuit board 72. In the same manner as in the previously described crystal resonator 3, the crystal resonator 35 has the pair of excitation electrodes and the crystal piece enclosed in, for example, the square package, however, differently from the crystal resonator 3, a not-shown electrode is provided on a lower surface of the package, and the electrode on the lower surface is connected to an electrode (not-shown) provided on The oscillation circuit board 72 via a solder or the like to electrically connect the crystal resonator 35 and the electrode provided on the oscillation circuit board 72. Further a flexible wiring 73 of, for example, a film shape is extended from rear surface of the oscillation circuit board 72. An end portion of the flexible wiring 73 is connected to a not-shown electrode provided on the base substrate 71, so that the electrode provided on the oscillation circuit board 72 and the electrode provided on the base substrate 71 are electrically connected via the flexible wiring 73. Note that the flexible wiring 73 has flexibility at a level, when the shock is applied to the crystal oscillator 7 from outside, not preventing the oscillation circuit board 72 from shaking due to a shock, namely at a level not causing a problem in the crystal resonator 35 via the oscillation circuit board 72. In the drawing, "74" denotes a cover provided on the base substrate 71 to cover the crystal resonator 35 and the oscillation circuit board 72, and a space 75 surrounded by the cover 74 and the base substrate 71 is isolated from the external space. Further, "76" in the drawing denotes an electrode provided on the reverse face of the base substrate 71 to connect the crystal oscillator 7 to equipment on which the crystal oscillator 7 is mounted. In such a crystal oscillator 7, the crystal resonator 35 oscillates driven by the oscillation circuit built in the oscillation circuit board 72 and the oscillated output power is outputted from the crystal oscillator 7. During the oscillation, in the same manner as in the crystal oscillator 2, the crystal oscillator 7 is heated to thereby keep the ambient temperature of the crystal resonator 35 at a constant temperature in the space 75.

According to the crystal oscillator 7, in the space 75 surrounded by the base substrate 71 and the cover 74, the buffer material 8 is fixed to the base substrate 71 and the oscillation circuit board 72 mounting the crystal resonator 35 thereon is supported in a floating state from the base substrate 71 by the buffer material 8, and the electrode provided on the base substrate 71 and the electrode provided on the oscillation circuit board 72 are electrically connected via the flexible wiring 73 having flexibility at a level not preventing the swing of the oscillation circuit board 72 caused by the shock applied to the base substrate 71. Accordingly, when the crystal oscillator 7 suffers a shock from outside, the shock conveyed from the base substrate 71 to the oscillation circuit board 72 is absorbed by the buffer material 8 to be eased and, at the same time, with the flexibility of the flexible wiring 73 described above, the oscillation circuit board 72 can release the conveyed shock by swinging above the base substrate 71. Further, the shock conveyed from the substrate 71 to the substrate 72 via the flexible wiring 73 is also suppressed as compared to the case where the hard wiring is used instead of the flexible wiring 73 and, as a result, the shock received by the oscillation circuit board 72 is suppressed, in which the shock conveyed from the oscillation circuit board 72 to the crystal resonator 35 is suppressed and therefore the crystal piece provided in the crystal resonator 35 is prevented from being shifted, broken, or the like, so that the problems such as a frequency variation and an oscillation stop caused thereby is suppressed, and, as a result, the crystal oscillator 7 can be improved in shock-resistance.

Figure 5A:
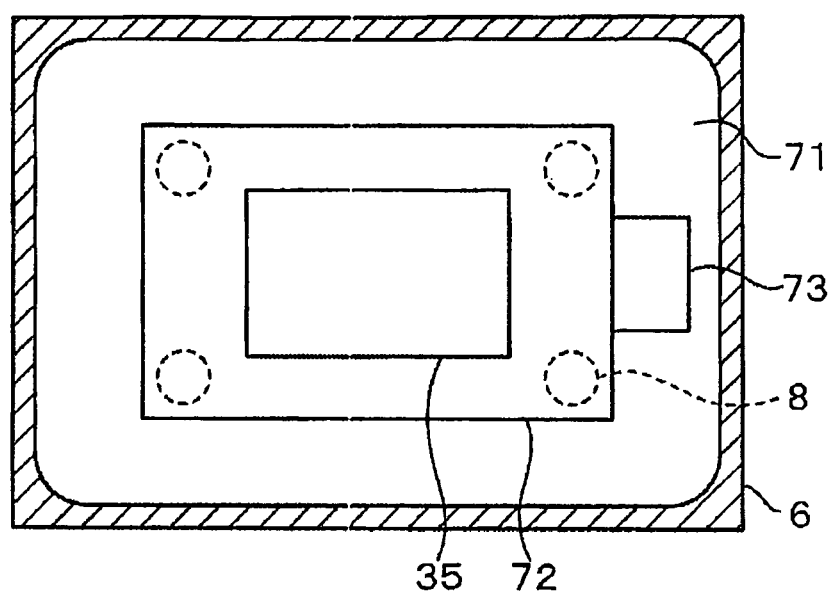
FIGS. 5A, 5B, 5C are explanation views showing a structure of a crystal oscillator according to still another embodiment of the present invention.
Figure 5B:
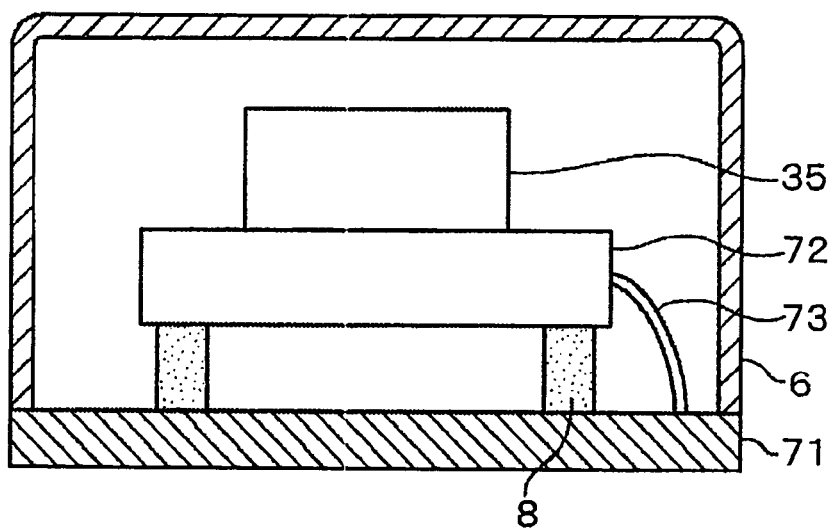
Figure 5C:
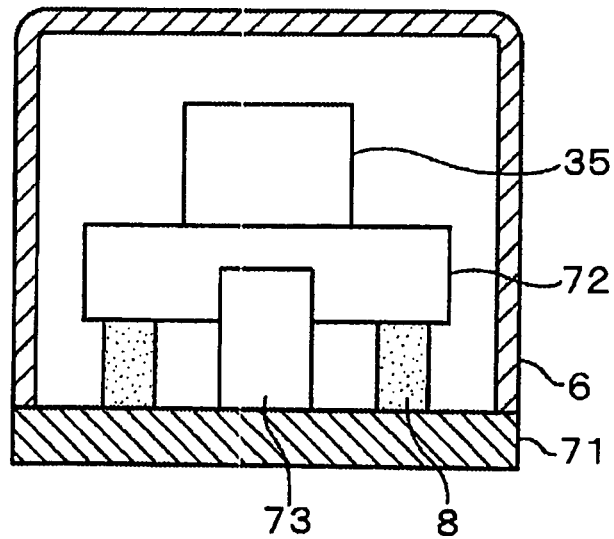
Figure 6A:
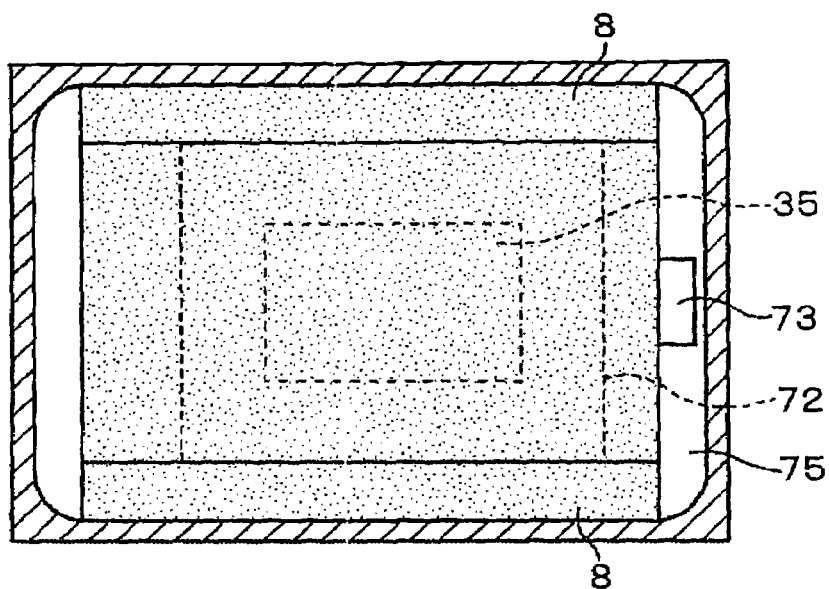
FIGS. 6A, 6B, 6C are explanatory views showing the structure of the crystal oscillator according to still another embodiment of the present invention.
Figure 6B:
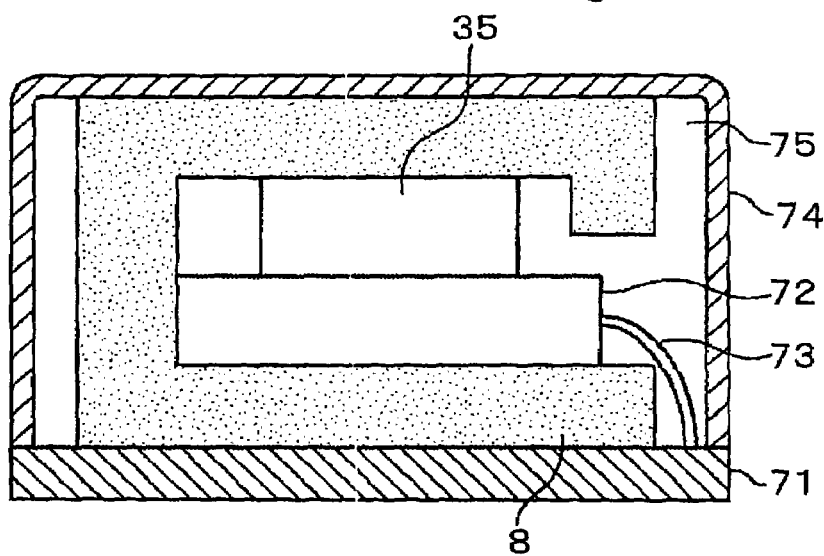
Figure 6C:
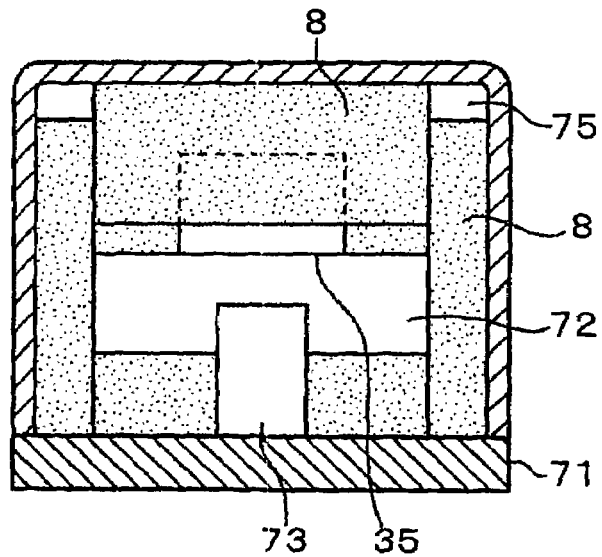
Figure 7A:
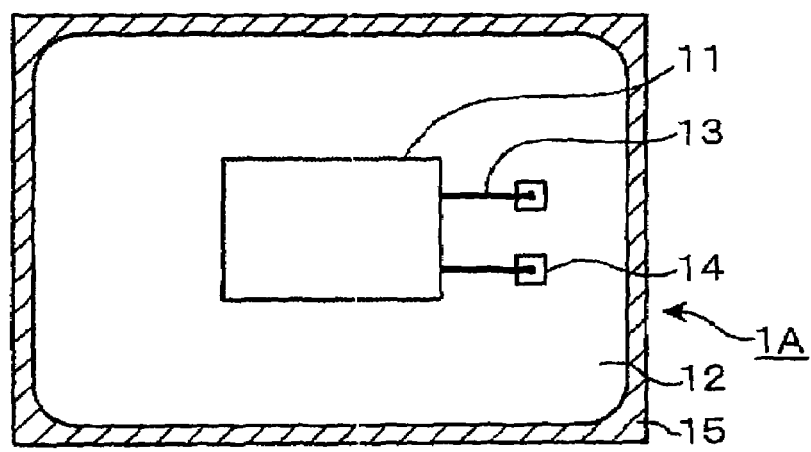
FIGS. 7A, 7B, 7C, 7D are explanatory views showing a structure of a conventionally-used crystal oscillator.
Figure 7B:
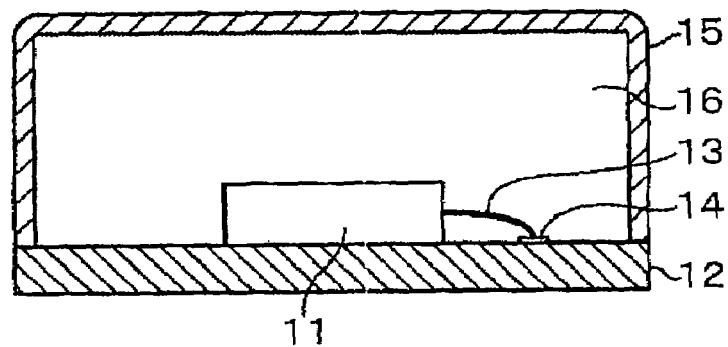
Figure 7C:
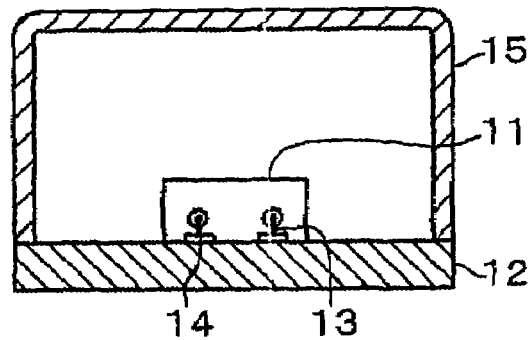
Figure 7D:
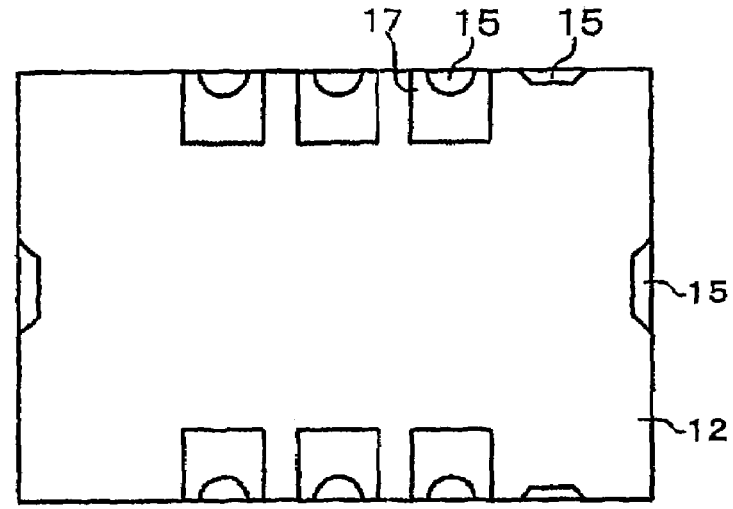
Figure 8A:
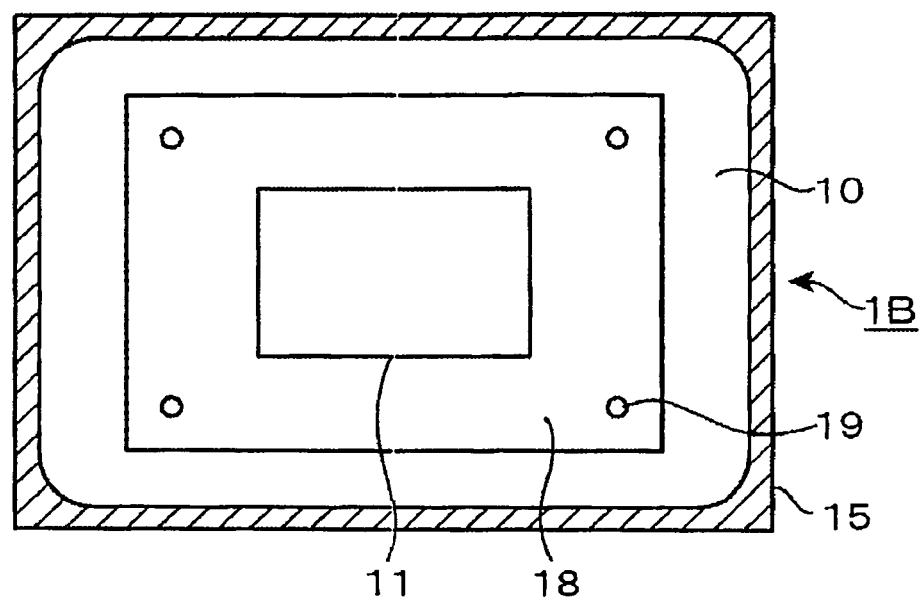
FIGS. 8A, 8B, 8C are explanatory views showing the structure of the conventionally-used another crystal oscillator.
Figure 8B:
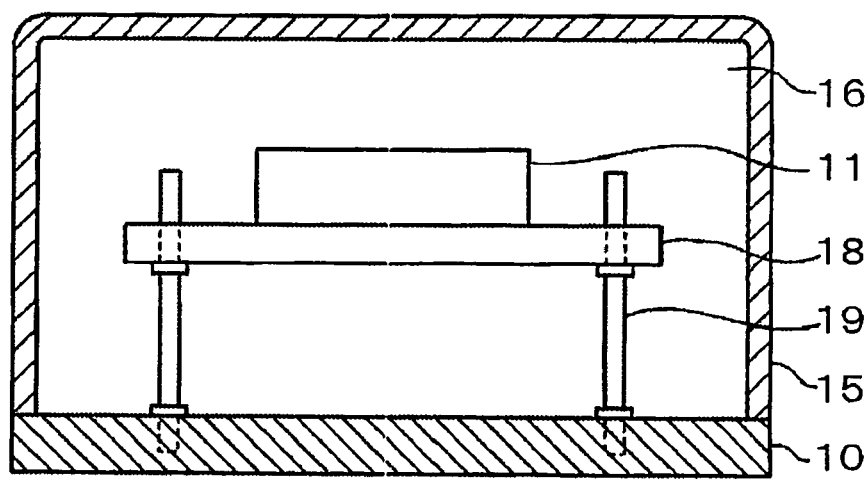
Figure 8C:
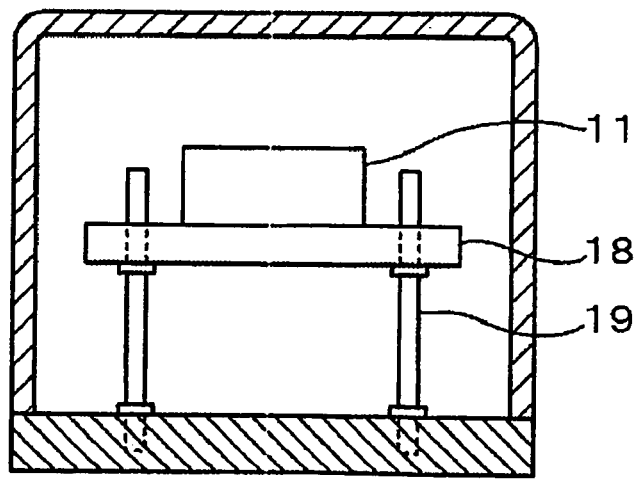

Meanwhile, the buffer material 8 is acceptable when it can be fixed onto the base substrate 71 and can support the oscillation circuit board 72 in a floating state from the base substrate 71, therefore, the buffer material 8 is not limited to the shape, number and layout as described above, and, as shown for example in FIGS. 5A, 5B, 5C, the buffer materials 8 may be provided on the base substrate 71 so as to support four corners of the oscillation circuit board 72. Note that, as a buffer material 8, for example, the above-described respective materials used as a buffer material 5 may be used other than the gel. Further, the buffer material 8 is not limited to be provided under the oscillation circuit board 72 only and it is also possible, as shown for example in FIGS. 6A, 6B, 6C, that the buffer material 8 is provided between the crystal resonator 35 and the cover 74 to be structured to surround the oscillation circuit board 72 and the crystal resonator 35 in the space 75. In this case, by forming the buffer material 8 using a material with high heat-insulating effect, the heat around the crystal resonator 35 heated at the time of the oscillation is prevented from being released outside the crystal oscillator, as described above. Accordingly, in the crystal oscillator in FIG. 6, the variation in the ambient temperature of the crystal resonator 35 due to external temperature variation or the like is suppressed more surely, so that the variation in the frequency oscillated by the crystal oscillator can be suppressed further and further the consumption power required to keep the ambient temperature of the crystal resonator 35 at a constant temperature in the space 75 can be suppressed.

What is claimed is:

1. A piezooscillator having a piezoelectric resonator comprising:
   a case surrounding a space in which said piezoelectric resonator is provided and including a substrate and a cover;
   a buffer material supporting said piezoelectric resonator and suppressing a shock conveyed from said case to said piezoelectric resonator; and
   a wiring member electrically connecting said piezoelectric resonator and an electrode provided on the substrate and having flexibility.

2. The piezooscillator according to claim 1,
   wherein said buffer material is provided on a side of the substrate and further exists between said piezoelectric resonator and the cover.

3. A piezooscillator having a piezoelectric resonator, comprising:
   a case surrounding a space in which said piezoelectric resonator is provided and including a first substrate and a cover;
   a second substrate mounting said piezoelectric resonator thereon;
   a buffer material supporting said second substrate and suppressing a shock conveyed from said case to said piezoelectric resonator; and
   a wiring member electrically connecting an electrode provided on the first substrate and an electrode provided on said second substrate and having flexibility.

4. The piezooscillator according to claim 3,
   wherein an oscillation circuit is built in said second substrate.

5. The piezooscillator according to claim 3,
   wherein said buffer material is provided on a side of the first substrate and further exists between said piezoelectric resonator and the cover.

6. A piezooscillator having a piezoelectric resonator, comprising:
   a case surrounding a space in which said piezoelectric resonator is provided and including a first substrate and a cover;
   a second substrate mounting said piezoelectric resonator thereon;
   a buffer material supporting said piezoelectric resonator and suppressing a shock conveyed from said case to said piezoelectric resonator; and
   a wiring member electrically connecting an electrode provided on the first substrate and an electrode provided on said second substrate and having flexibility.

7. The piezooscillator according to claim 6,
   wherein an oscillation circuit is built in said second substrate.

8. The piezooscillator according to claim 6,
   wherein said buffer material is provided on a side of the first substrate and further exists between said piezoelectric resonator and the cover.

* * * * *